United States Patent
Miyake et al.

(10) Patent No.: US 6,605,357 B1
(45) Date of Patent: Aug. 12, 2003

(54) BONDING METHOD AND BONDING STRUCTURE OF THERMOPLASTIC RESIN MATERIAL

(75) Inventors: Toshihiro Miyake, Inuyama (JP); Katsuaki Kojima, Nagoya (JP); Hiroyasu Iwama, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/621,134

(22) Filed: Jul. 20, 2000

(30) Foreign Application Priority Data

Jul. 28, 1999 (JP) .......................... 11-214222
May 31, 2000 (JP) ....................... 2000-161821

(51) Int. Cl.[7] .......................... B32B 31/06; B32B 7/04
(52) U.S. Cl. .................... 428/420; 428/473.5; 428/480; 427/207.1; 427/336; 427/389.7; 427/384; 427/407.1; 427/407.2; 427/410; 156/310; 156/313; 156/314
(58) Field of Search ............................. 428/420, 473.5, 428/480; 427/207.1, 336, 389.7, 384, 407.1, 407.2, 410; 156/310, 313, 314

(56) References Cited

U.S. PATENT DOCUMENTS

| | | | |
|---|---|---|---|
| 3,755,886 A | 9/1973 | Hermann | 228/201 |
| 4,143,005 A | 3/1979 | Packer | 228/175 |
| 4,165,244 A | 8/1979 | Jacobs | 148/23 |

(List continued on next page.)

FOREIGN PATENT DOCUMENTS

| | | |
|---|---|---|
| EP | 0077622 | 4/1983 |
| JP | 58209497 | 12/1983 |
| JP | 59153595 | 9/1984 |
| JP | 60187465 | 9/1985 |
| JP | 62006795 | 1/1987 |
| JP | 63033196 | 2/1988 |
| JP | 63299888 | 12/1988 |
| JP | 645039 | 1/1989 |
| JP | 64-18600 | 1/1989 |
| JP | 01157767 | 6/1989 |
| JP | 02290693 | 11/1990 |
| JP | 03094995 | 4/1991 |
| JP | 03106594 | 5/1991 |
| JP | 03207569 | 9/1991 |
| JP | 04135092 | 5/1992 |
| JP | 05042388 | 2/1993 |
| JP | 569189 | 3/1993 |
| JP | 05069188 | 3/1993 |
| JP | 5177385 | 7/1993 |
| JP | 05185282 | 7/1993 |
| JP | 05185285 | 7/1993 |
| JP | 05200585 | 8/1993 |
| JP | 06006020 | 1/1994 |
| JP | 06071481 | 3/1994 |
| JP | 06087090 | 3/1994 |
| JP | 06136299 | 5/1994 |
| JP | 06226485 | 8/1994 |
| JP | 06269988 | 9/1994 |
| JP | 07088687 | 4/1995 |
| JP | 07108397 | 4/1995 |
| JP | 07144292 | 6/1995 |

*Primary Examiner*—Leszek Kiliman
(74) *Attorney, Agent, or Firm*—Posz & Bethards, PLC

(57) ABSTRACT

A PEI film to be bonded is disposed on a glass epoxy substrate through an alkane film, and a position to be adhered is heated to a temperature not less than the glass transition point Tg of the PEI film, thereby forming an adhesion-improving layer in which the alkane is dispersed into the PEI film, in the PEI film at the interface with the glass epoxy substrate. That is, the PEI film is bonded to the glass epoxy substrate through the adhesion-improving layer. Therefore, an adhesive strength is improved because the adhesion-improving layer has an elastic modulus lower than that of the PEI film.

15 Claims, 8 Drawing Sheets

U.S. PATENT DOCUMENTS

| | | | |
|---|---|---|---|
| 4,278,479 A | 7/1981 | Anderson et al. | 148/23 |
| 4,441,924 A | 4/1984 | Arbib | 428/558 |
| 4,460,414 A | 7/1984 | Hwang | 148/23 |
| 4,919,729 A | 4/1990 | Elmgren et al. | 148/24 |
| 4,995,921 A | 2/1991 | Davis et al. | 148/22 |
| 5,004,508 A | 4/1991 | Mace et al. | 148/22 |
| 5,004,509 A | 4/1991 | Bristol | 148/23 |
| 5,011,546 A | 4/1991 | Frazier et al. | 148/23 |
| 5,064,480 A | 11/1991 | Dershem et al. | 148/22 |
| 5,125,560 A | 6/1992 | Degani et al. | 228/223 |
| 5,150,832 A | 9/1992 | Degani et al. | 228/224 |
| 5,177,134 A * | 1/1993 | Mullen, III et al. | 524/284 |
| 5,196,070 A | 3/1993 | Ables et al. | 148/23 |
| 5,211,763 A | 5/1993 | Takemoto et al. | 148/23 |
| 5,334,261 A | 8/1994 | Minahara et al. | 148/23 |
| 5,338,619 A | 8/1994 | Fukuda et al. | 428/623 |
| 5,477,086 A | 12/1995 | Rostoker et al. | 83/666 |
| 5,558,271 A | 9/1996 | Rostoker et al. | 228/180.22 |
| 5,669,548 A | 9/1997 | Miyake et al. | 228/224 |
| 5,919,317 A | 7/1999 | Tanahashi et al. | 148/24 |
| 6,060,160 A * | 5/2000 | Fontanilla | 428/346 |
| 6,218,030 B1 | 4/2001 | Miyake et al. | 428/618 |

* cited by examiner

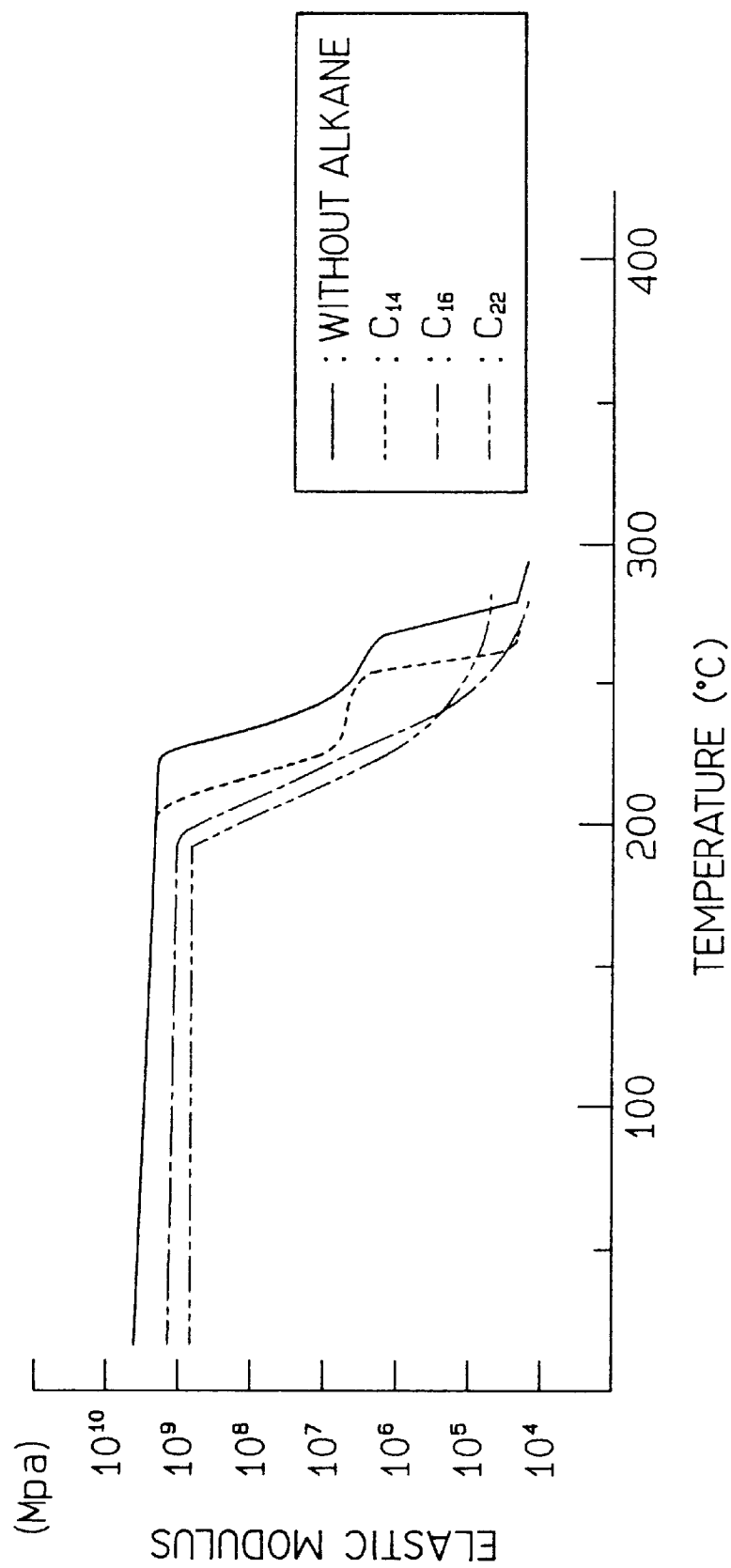

BONDING METHOD AND BONDING STRUCTURE OF THERMOPLASTIC RESIN MATERIAL

CROSS-REFERENCE TO RELATED APPLICATION

This application is related to and claims priority from Japanese Patent Applications No. Hei. 11-214222 filed on Jul. 28, 1999, and No. 2000-161821 filed on May 31, 2000, the contents of which are hereby incorporated by reference.

BACKGROUND OF THE INVENTION

1. Field of the Invention

The present invention relates to a bonding method and a bonding structure of a thermoplastic resin material, which can be used, for example, for an adhesion of a thermoplastic resin film to an adherend.

2. Description of the Related Art

It is the common practice to bond a thermoplastic resin film after melting the film and then bonding the molten film to an adherend. This process however involves a problem that upon bonding of the thermoplastic resin film while stacking it on a copper foil or glass epoxy substrate, adhesive strength becomes insufficient.

SUMMARY OF THE INVENTION

In view of the foregoing problems, it is an object of the present invention to provide a bonding method and a bonding structure of a thermoplastic resin material, which can improve adhesive strength with an adherend.

According to the present invention, a thermoplastic resin material is disposed on an adherend through a film composed of a dispersing substance which reduces an elastic modulus of the thermoplastic resin material when being dispersed into the thermoplastic resin material, and a position to be adhered is heated to a temperature not less than a glass transition point of the thermoplastic resin material, thereby forming an adhesion-improving layer in which the dispersing substance is dispersed in the thermoplastic resin material, at an interface with the adherend. That is, the thermoplastic resin material is bonded to the adherend through the adhesion-improving layer. Thus, the adhesive strength between the thermoplastic resin material and the adherend is improved.

BRIEF DESCRIPTION OF THE DRAWINGS

Additional objects and advantages of the present invention will be more readily apparent from the following detailed description of a preferred embodiment when taken together with the accompanying drawings, in which:

FIG. 9 is a graph illustrating measuring results of an elastic modulus according to the embodiment.

DETAILED DESCRIPTION OF PREFERRED EMBODIMENT

Figure 1:
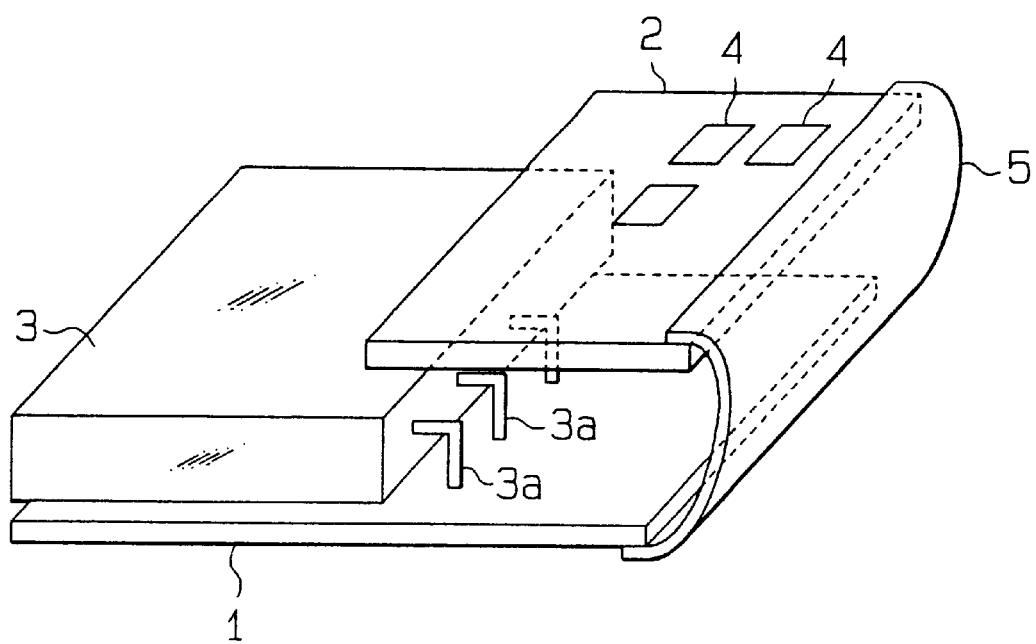
FIG. 1 is a perspective view illustrating a part of an electronic device according to a preferred embodiment of the present invention.

A preferred embodiment of the present invention will be described in accordance with accompanying drawings. FIG. 1 illustrates a part of an electronic device according to the embodiment. Inside of the electronic device, a rigid printed circuit board 1 and a rigid printed circuit board 2 are supported. On the rigid printed circuit board 1, various electronic parts are mounted. In FIG. 1, an IC 3 of DIP package is inserted in and mounted on the rigid printed circuit board 1 by a pin 3a. Similarly, various electronic parts 4 are mounted on the rigid printed circuit board 2. A glass cloth base epoxy resin is employed for an insulating substrate of the rigid printed circuit boards 1, 2.

A flexible printed circuit board 5 is electrically connected with the rigid printed circuit board 1 and the rigid printed circuit board 2 horizontally disposed in parallel. In FIG. 1, the flexible printed circuit board 5 is adhered to the right side of each of the rigid printed circuit boards 1,2. A polyether imide (PEI), which is a thermoplastic resin, is used as a base film of the flexible printed circuit board 5.

Figure 2A:
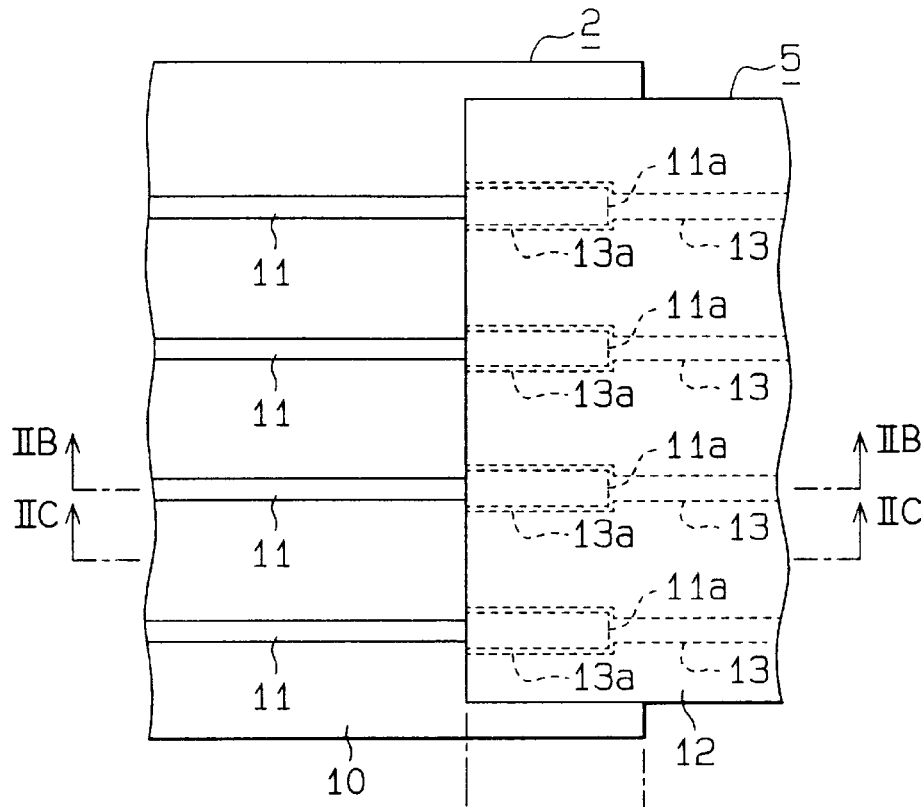
FIG. 2A is an enlarged view illustrating an adhered position according to the embodiment.
Figure 2B:
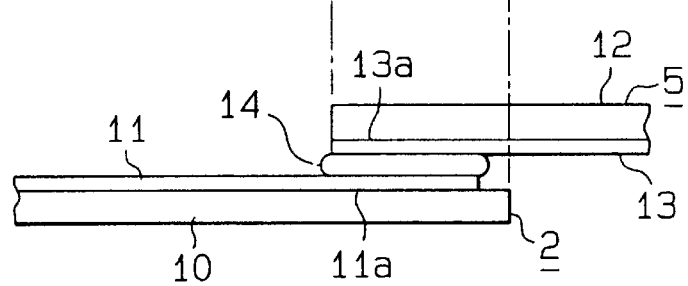
FIG. 2B is a cross-sectional view taken along line IIB—IIB in FIG. 2A.
Figure 2C:
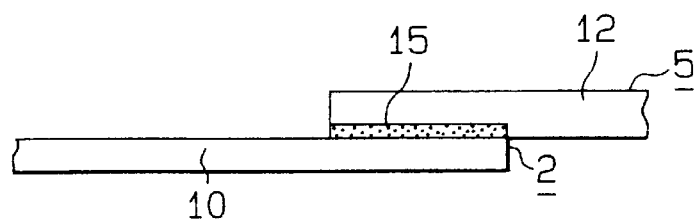
FIG. 2C is a cross-sectional view taken along line IIC—IIC in FIG. 2A.

FIG. 2A is an enlarged view illustrating a position at which the rigid printed circuit board 2 and the flexible printed circuit board 5 are adhered. As shown in FIGS. 2A, 2B and 2C, a plurality of conductor patterns 11 are formed on the upper surface of the glass epoxy substrate 10 of the rigid printed circuit board 2 and a land (e.g., square land) 11a is disposed at the end of the glass epoxy substrate 10. A PEI film 12 of the flexible printed circuit board 5 has a thickness of 100 μm. A plurality of conductor patterns 13 are formed on a surface of the PEI film 12, and a land (e.g., square land) 13a is disposed at an end of the PEI film 12. At the bonding position of the rigid printed circuit board 2 and flexible printed circuit board 5, the land 11a of the conductor pattern 11 and the land 13a of the conductor pattern 13 are bonded by a solder 14, as shown in FIG. 2B. At the same time, the glass epoxy substrate 10 of the rigid printed circuit board 2 is bonded with the PEI film 12 of the flexible printed circuit board 5.

At the bonding position at which the glass epoxy substrate 10 and PEI film 12 are bonded, an adhesion-improving layer 15 is provided on the PEI film 12 of 100 μm thickness at the interface with the glass epoxy substrate 10. In the adhesion-improving layer 15, a hydrocarbon compound has been dispersed. As the hydrocarbon compound, tetradecane ($C_{14}H_{20}$) which is one of alkanes is employed. The adhesion-improving layer 15 has a thickness of about 20 μm. The PEI film 12 is firmly adhered to the glass epoxy substrate 10, while forming, on the interface therebetween, the adhesion-improving layer 15 wherein tetradecane has been dispersed. Because the hydrocarbon compound is hydrophobic, it exhibits excellent moisture resistance at the adhered position.

In accordance with FIGS. 3A–3C, a description will next be made of a method for adhering the PEI film 12 to the glass epoxy substrate 10 which is an adherend.

Figure 3A:
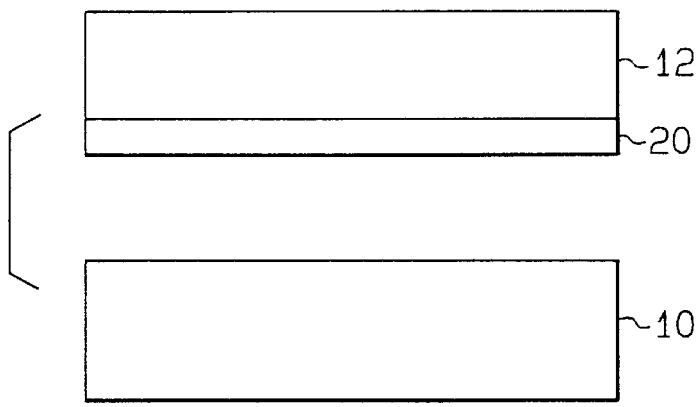
FIGS. 3A, 3B and 3C are cross-sectional views illustrating an adhering method according to the embodiment.

As illustrated in FIG. 3A, the PEI film 12, as a thermoplastic resin material, and the glass epoxy substrate 10 are provided first. These PEI film 12 and glass epoxy substrate 10 each has a conductor pattern formed thereon. Tetradecane ($C_{14}H_{20}$), which is an alkane, is applied to the position of the PEI film 12 to be adhered to form the corresponding film (which will hereinafter be called "alkane film") 20. Tetradecane ($C_{14}H_{20}$) has a boiling point of 250° C.

Preferred examples of the alkane include $C_{9-30}$ alkanes, more specifically, nonane ($C_9H_{20}$), decane ($C_{10}H_{22}$), undecane ($C_{11}H_{24}$), dodecane ($C_{12}H_{26}$), tridecane ($C_{13}H_{28}$), pentadecane ($C_{15}H_{32}$), hexadecane ($C_{16}H_{34}$), heptadecane ($C_{17}H_{36}$), octadecane ($C_{18}H_{38}$), nonadecane ($C_{19}H_{40}$), eicosane ($C_{20}H_{42}$), heneicosane ($C_{21}H_{46}$), docosane ($C_{22}H_{46}$), tricosane ($C_{23}H_{48}$), tetracosane ($C_{24}H_{50}$), pentacosane ($C_{25}H_{52}$), hexacosane ($C_{26}H_{54}$), heptacosane ($C_{27}H_{56}$), octacosane ($C_{28}H_{58}$), nonacosane ($C_{29}H_{60}$) and triacontane ($C_{30}H_{62}$).

Figure 3B:
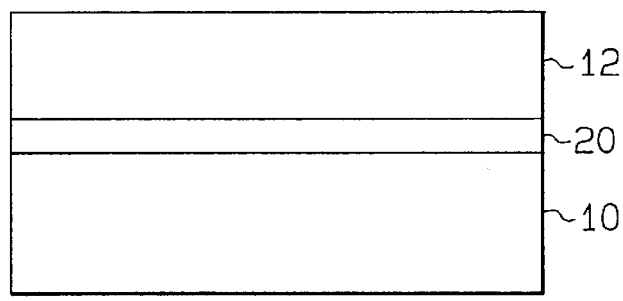

Then, as illustrated in FIG. 3B, the PEI film 12 is disposed on the glass epoxy substrate 10 with the alkane film interposed therebetween.

Figure 3C:
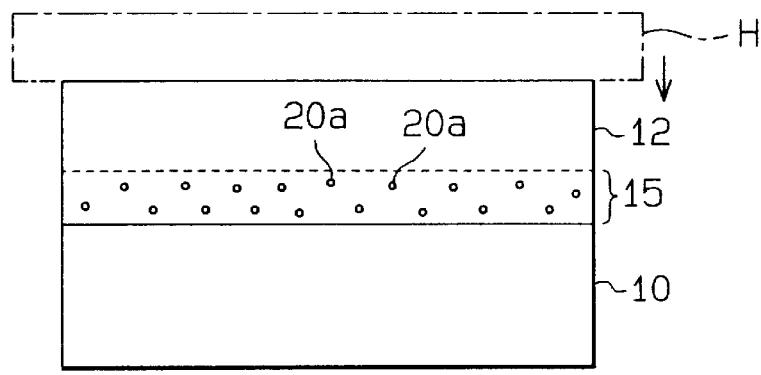

As illustrated in FIG. 3C, the heater head H of a heating tool is pressed against the position to be adhered to heat the position to 270° C. which is higher than 240° C. of the glass transition point Tg of the polyether imide (PEI). At the same time, a pressure of 0.5 MPa is applied downward from the heater head H between the PEI film 12 and glass epoxy substrate 10. Heating and pressurization are carried out for 10 seconds.

As a result, as illustrated in FIG. 3C, melting of the PEI film 12 and boiling of the alkane of the alkane film 20 occur simultaneously, whereby the adhesion-improving layer 15, wherein alkane 20a has been dispersed, is formed on the molten PEI film 12 at the interface with the glass epoxy substrate 10. Under such a state, the PEI film 12 is adhered to the glass epoxy substrate 10.

Strong adhesive strength is attained by adhering the PEI film 12 by using, on the interface to be adhered, the adhesion-improving layer 15 wherein the alkane 20a has been dispersed. As a result, an adhesion with high strength and high insulation reliability is obtained. In addition, owing to the hydrophobic property of the hydrocarbon compound such as alkane, the method according to the present invention brings about excellent humidity-proof insulation properties. Moreover, the layer 15 having an alkane dispersed in the PEI film 12 has a reduced modulus of elasticity, leading to good adhesion with the overlying glass epoxy substrate 10.

An adhesion mechanism will be described with reference to FIGS. 4A–4D.

Figure 4A:
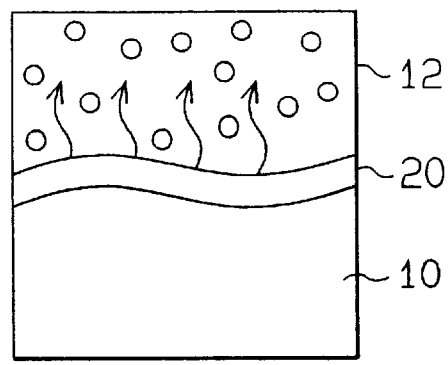
FIGS. 4A, 4B, 4C and 4D are views illustrating an adhesion mechanism according to the embodiment.
Figure 4B:
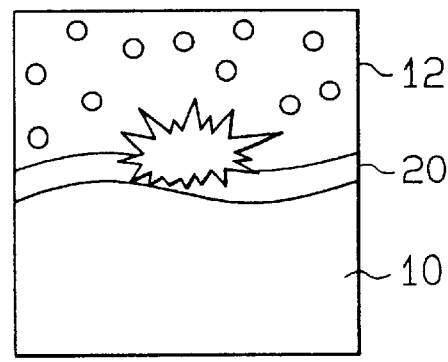

When the polyether imide (PEI) is heated to a temperature exceeding its glass transition point Tg, the alkane in the alkane film 20 is dispersed (penetrated) into the side of the PEI film 12 as illustrated in FIG. 4A. Alternately, the energy caused by boiling and volumetric expansion of the alkane accelerates the dispersion (penetration) of the alkane into the side of the PEI film 12 (or energy generated by volumetric expansion is effective for removing the stains adsorbed on the surface of the PEI film 12) as illustrated in FIG. 4B.

Figure 4C:
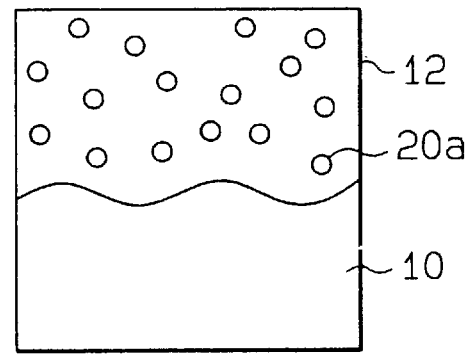
Figure 4D:
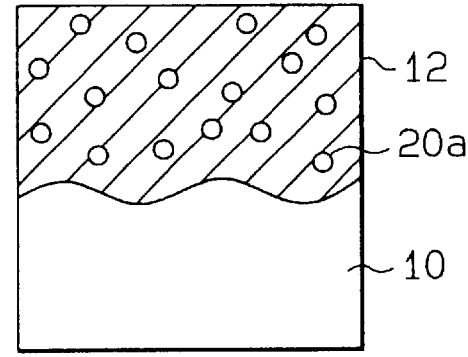

As illustrated in FIG. 4C, a modulus of elasticity lowers in a region (layer of 20 μm thick) of the PEI film 12 wherein the alkane has been penetrated, which improves the wetness with the surface of the glass epoxy substrate 10. As a result, after curing of PEI, the product (laminate) is able to have high adhesive strength and high insulation reliability.

As the thermoplastic resin material, not only the polyether imide (PEI) but also polyether ether ketone (PEEK) or a material containing polyether imide (PEI) or polyether ether ketone (PEEK) can be employed. More specifically, a thermoplastic resin composition containing 65 to 35 wt. % of a polyether ether ketone resin and 35 to 65 wt. % of an so amorphous polyether imide resin may be used. Alternatively, as a thermoplastic resin material (a base film of the flexible printed circuit board), polyethylene naphthalate (PEN) or polyethylene terephthalate (PET) may be used. In short, a material containing at least one of PEI, PEEK, PEN and PET can be used.

Figure 5:
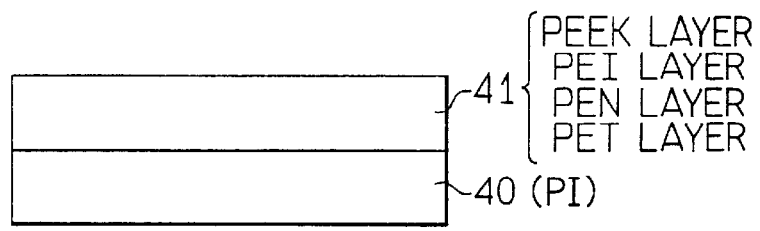
FIG. 5 is a view illustrating a substrate of a thermoplastic resin material according to a modification of the embodiment.

Alternatively, as the thermoplastic resin material, a substrate obtained by stacking (laminating) at least one layer 41 selected from PEEK, PEI, PEN and PET on a polyimide base (PI) 40, as illustrated in FIG. 5 may be used. Upon stacking, both the base 40 and the layer 41 can be adhered with an adhesive. The polyimide base 40 has a thermal expansion coefficient of about 15 to 20 ppm which is close to that (17 to 20 ppm) of copper frequently employed as an interconnection so that peeling or distortion of the flexible printed circuit board can be prevented. An alkane penetrates into the surface of the PEEK-PEI, PEI or glass epoxy substrate, while it slightly penetrates into PEN. In the latter case, high adhesive strength is attained, because the boiling alkane removes the stain adsorbed onto the surface of the thermoplastic insulation sheet and makes the polar group of the thermoplastic resin expose to the surface.

Results of various tests made on adhesion will next be described.

Figure 6:
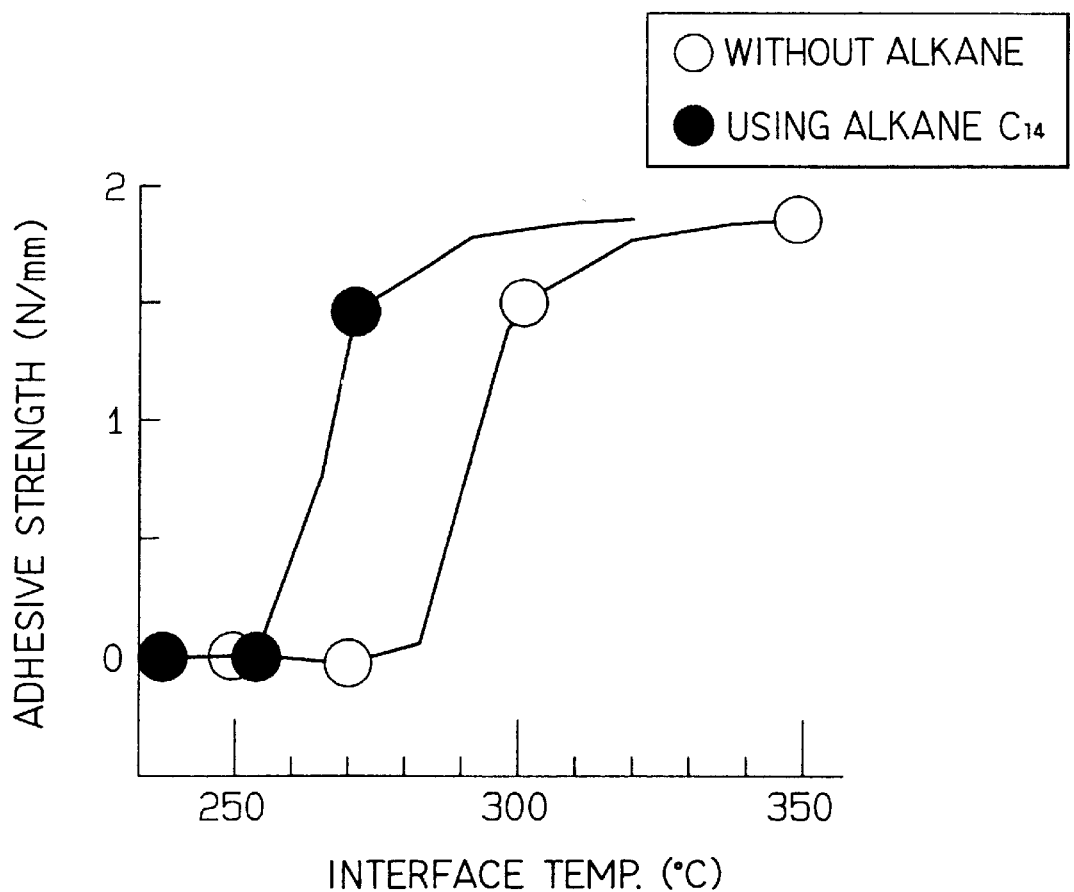
FIG. 6 is a graph illustrating measuring results of adhesive strength when an alkane is used and is not used, according to the embodiment.

FIG. 6 illustrates the measuring results of the adhesive strength at varied interface temperatures. For the test, adhesion is performed with and without using an alkane film ($C_{14}H_{30}$). From FIG. 6, it is understood that adhesive strength of 1.5 N/mm is attained by the use of an alkane film upon adhesion at 270° C. In other words, the same adhesive strength is available by heating at a lower temperature when the alkan film is used. Specifically, for attaining the adhesive strength of 1.5 N/mm in FIG. 6, heating at about 300° C. is required when an alkane is not used, while heating only at about 270° C. is sufficient when an alkane is used.

Figure 7A:
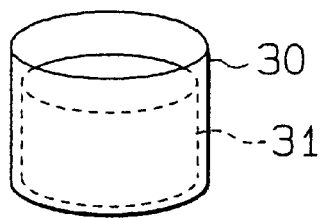
FIGS. 7A, 7B, 7C and 7D are views illustrating preparation steps of a sample according to the embodiment.
Figure 7B:
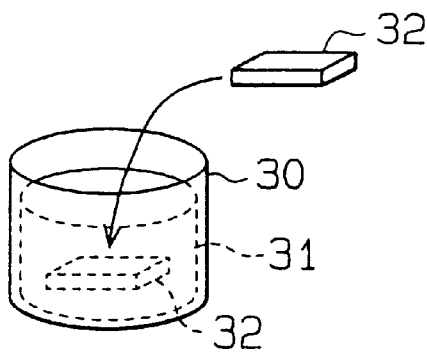
Figure 7C:
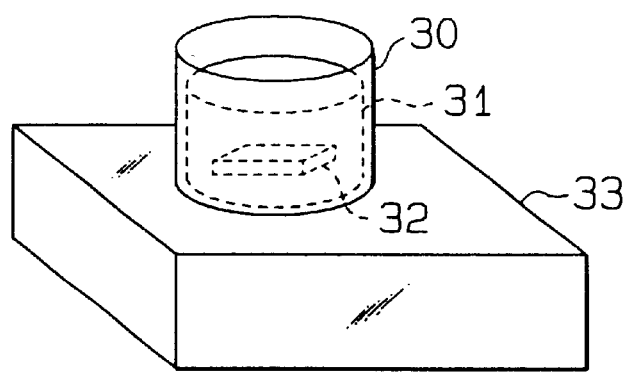
Figure 7D:

Next, penetration of an alkane into polyether imide will be described. As illustrated in FIG. 7A, an alkane 31 is charged in a container 30. Then, as illustrated in FIG. 7B, a PEI film 32, which is a test piece, is placed in the alkane 31. As illustrated in FIG. 7C, the container 30 is disposed on a hot plate 33 and is heated. The PEI film 32 is taken out from the alkane 31 as illustrated in FIG. 7D and it is weighed. Supposing that the weight of the PEI film 32 before it is placed in the alkane 31 is W1 and that after it is taken out from the alkane 31 is W2, the penetration amount (i.e., interfusion percentage %) is expressed by (W2-W1)/W1× 100.

Figure 8:
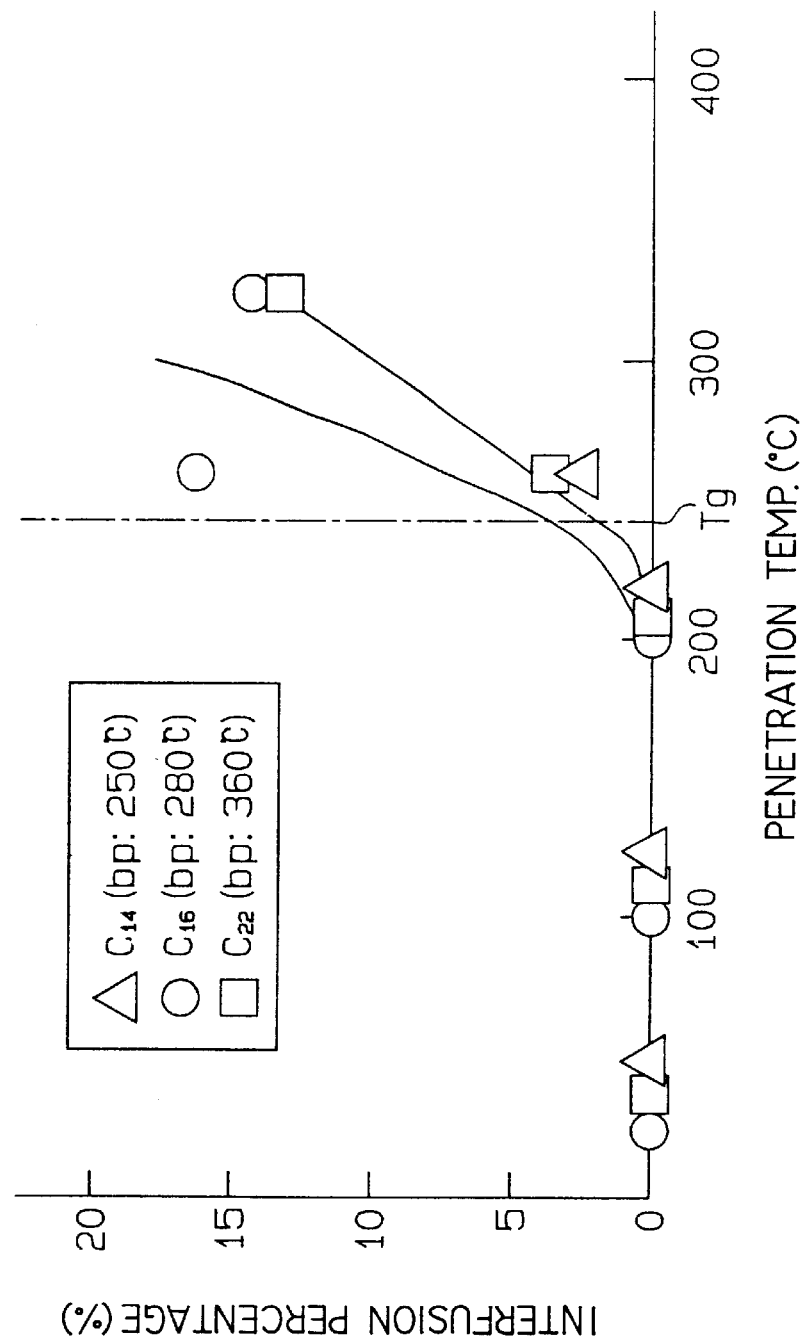
FIG. 8 is a graph illustrating measuring results of an interfusion percentage according to the embodiment.

FIG. 8 illustrates the measuring results of the interfusion percentage (%) at varied temperatures. As the alkane, $C_{14}$, $C_{16}$ and $C_{22}$ alkanes are used and their boiling points are 250, 280 and 360° C., respectively. As shown in FIG. 8, penetration into polyether imide occurs at a temperature higher than its glass transition point Tg. Thus, the penetration amount is increased at a temperature higher than the glass transition point TG of polyether imide, so that adhesive strength is increased.

FIG. 9 illustrates the measuring results of temperature dependence of modulus of elasticity. As alkanes, $C_{14}$, $C_{16}$ and $C_{22}$ alkanes are used. The modulus of elasticity of a PET film is measured after putting it in an alkane, heating on a hot plate and then, taking it out from the alkane.

As shown in FIG. 9, by heating at about 200° C. or greater, a lowering in the modulus of elasticity of the PEI film became larger than that of the PEI film not put into the alkane. The modulus of elasticity lowers by the penetration of an alkane, so that an improvement in the wetness with the surface of the glass epoxy substrate 10 is obtained.

According to the embodiment, the PEI film 12 is adhered with the glass epoxy substrate 10 by disposing the PEI film 12 on the glass epoxy substrate 10 through the alkane film 20, and heating a position to be adhered to a temperature not less than the glass transition point Tg of PEI. Therefore, the adhesion-improving layer 15, wherein the alkane has been dispersed, is formed on the PEI film 12 at the interface with the glass epoxy substrate 10. Adhesion of the PEI film 12 via the adhesion-improving layer 15 brings about an improvement in the adhesive strength.

Although the present invention has been fully described in connection with the preferred embodiment thereof with reference to the accompanying drawings, it is to be noted that various changes and modifications will become apparent to those skilled in the art.

For example, in the above-described embodiment, as the hydrocarbon compound, alkanes are employed as the example. However, substances having a side chain of a carbon bond, alkens having a carbon double bond in the skeleton of the hydrocarbon, alkynes having a triple bond and aromatic or cyclic hydrocarbon group free from a functional group can also be employed. In addition, silicon oils can be used. That is, any substance capable of reducing a modulus of elasticity can be employed.

As the adherend, a glass epoxy substrate is used. In addition to it, a thermoplastic or thermosetting resin and also a metallic material such as copper foil can also be employed.

When an adhesion is performed, it is not always necessary to heat the hydrocarbon compound to its boiling point. When, for example, tetradecane ($C_{14}H_{30}$) is used, heating temperature may be 250° C. or less, if it exceeds the glass transition point TG of PEI, that is, 240° C.

In FIG. 2, the and 11*a* or 13*a* is a square land, but the land may be any form such as circle land or land of different shape.

Such changes and modifications are to be understood as being within the scope of the present invention as defined by the appended claims.

What is claimed is:

1. A method for bonding a thermoplastic resin material onto an adherend, comprising:

disposing the thermoplastic resin material on the adherend through a film composed of a dispersing substance which reduces an elastic modulus of the thermoplastic resin material when dispersed into the thermoplastic resin material; and heating a position to be adhered to a temperature not less than a glass transition point of the thermoplastic resin material, wherein during the heating, the dispersing substance is dispersed into the thermoplastic resin material at an interface with the adherend to form an adhesion-improving layer on the adherend; and the formed adhesion-improving layer has an elastic modulus lower than that of the thermoplastic resin material.

2. The method according to claim 1, further comprising pressing for pressing between the thermoplastic resin material and the adherend, which is performed during the heating.

3. The method according to claim 1, wherein the dispersing substance is a hydrocarbon compound.

4. The method according to claim 3, wherein the hydrocarbon compound is one of an alkane, an alkene and an alkyne.

5. The method according to claim 1, wherein the thermoplastic resin material includes at least one substance selected from the group consisting of polyether imide, polyether ether ketone, polyethylene naphthalate and polyethylene terephthalate.

6. The method according to claim 1, further comprising forming the thermoplastic resin material into a substrate, by stacking a layer composed of at least one substance selected from the group consisting of polyether ether ketone, polyether imide, polyethylene naphthalate and polyethylene terephthalate, on a polyimide base.

7. A bonding structure comprising:

an adherend;

a thermoplastic resin material to be adhered to the adherend; and an adhesion-improving layer formed in the thermoplastic resin material at the interface with the adherend by a dispersion of a dispersing substance into the thermoplastic resin material, the adhesion-improving layer having an elastic modulus lower than that of the thermoplastic resin material, wherein the thermoplastic resin material is bonded with the adherend through the adhesion-improving layer.

8. The bonding structure according to claim 7, wherein the dispersing substance is a hydrocarbon compound.

9. The bonding structure according to claim 8, wherein the hydrocarbon compound is any one of an alkane, alkene and alkyne.

10. The bonding structure according to claim 7, wherein the thermoplastic resin material includes at least one substance selected from the group consisting of polyether imide, polyether ether ketone, polyethylene naphthalate and polyethylene terephthalate.

11. The bonding structure according to claim 7, wherein the thermoplastic resin material is formed into a substrate, by stacking a layer composed of at least one substance selected from the group consisting of polyether ether ketone, polyether imide, polyethylene naphthalate and polyethylene terephthalate, on a polyimide base.

12. The bonding structure according to claim 7, wherein the adherend is a glass epoxy substrate.

13. The bonding structure according to claim 7, wherein the adherend is a metallic material.

14. The bonding structure according to claim 7, wherein the adhesion-improving layer is formed by heating the dispersing substance and the thermoplastic resin material.

15. A method for bonding a thermoplastic resin material onto an adherend, comprising:

interspersing a film between the thermoplastic resin material and the adherend, the film including a dispersing substance that reduces an elastic modulus of the thermoplastic resin material when dispersed therein;

disposing the thermoplastic resin material and the film on the adherend; and heating a position at which the thermoplastic resin material is to be adhered to the adherend and defined by overlapping portions of the film, the thermoplastic resin material and the adherend to a temperature not less than a glass transition point of the thermoplastic resin material, wherein during the heating, the dispersing substance is dispersed into the thermoplastic resin material to form an adhesion-improving layer by which the thermoplastic resin material is adhered to the adherend, the adhesion improving layer having an elastic modulus lower than that of the thermoplastic resin material.

* * * * *